United States Patent [19]
Liu et al.

[11] Patent Number: 5,838,622
[45] Date of Patent: Nov. 17, 1998

[54] RECONFIGURABLE MULTIPLEXED ADDRESS SCHEME FOR ASYMMETRICALLY ADDRESSED DRAMS

[75] Inventors: Lawrence C. Liu, Menlo Park; Li-Chun Li, Los Gatos, both of Calif.; Michael A. Murray, Bellevue, Wash.

[73] Assignee: Mosel Vitelic Corporation, San Jose, Calif.

[21] Appl. No.: 850,933

[22] Filed: Feb. 28, 1997

[51] Int. Cl.⁶ .................................................. G11C 8/00
[52] U.S. Cl. ............................. 365/230.02; 365/230.08
[58] Field of Search ........................ 365/230.02, 230.04, 365/230.06, 230.08

[56] References Cited

U.S. PATENT DOCUMENTS

| | | | |
|---|---|---|---|
| 5,083,296 | 1/1992 | Hara | 365/230.02 |
| 5,289,430 | 2/1994 | Tran | 365/230.08 |
| 5,305,282 | 4/1994 | Choi | 365/230.08 |
| 5,537,353 | 7/1996 | Rao | 365/189.02 |
| 5,600,604 | 2/1997 | Chen | 365/230.06 |

*Primary Examiner*—Son Mai
*Attorney, Agent, or Firm*—Skjerven, Morrill, MacPherson, Franklin & Friel

[57] ABSTRACT

A long X bit or a long Y bit is stored in a latch and used to supplement the Y address bits in an asymmetric DRAM memory thereby to allow one part to be used for a design requiring a long X bit and also for a design requiring a long Y bit.

24 Claims, 2 Drawing Sheets

— 5,838,622 —

RECONFIGURABLE MULTIPLEXED ADDRESS SCHEME FOR ASYMMETRICALLY ADDRESSED DRAMS

FIELD OF THE INVENTION

This invention relates to dynamic random access memories and in particular to a reconfigurable multiplexed address for asymmetrically addressed DRAMs.

BACKGROUND OF THE INVENTION

A dynamic random access memory ("DRAM") contains memory cells arranged in rows and columns. To address a particular memory cell in the array, the X and Y location of that memory cell in the array must be known. Thus it is necessary to provide an X address signal and a Y address signal to the DRAM in order to identify the particular memory cell to be read out. If the memory cells are arranged in a block of rows and columns, the number of memory cells will equal the number of rows R times the number of columns C. To access the particular row in which a memory cell is located $\log_2 R$ bits are used for the row address. To access the particular column in which the memory cell is located $\log_2 C$ bits are used for the column address. An asymmetric array has the number of rows differing from the number of columns. In a 128K DRAM, for example, 17 bits are required to address all 128K memory cells. Because an odd number of address bits (17) is required to address all memory cells in the array, the array is considered to be asymmetrically addressed in the sense that the number of row address bits will always differ from the number of column address bits. Some users of such asymmetric DRAMs prefer to have more X address bits than Y address bits. This is known as a "long X". Other users prefer to have more Y address bits than X address bits. This is known as a "long Y". Thus asymmetric DRAMs can have one more X bit than Y bit or one more Y bit than X bit because the number of bits necessary to address the memory cells is an odd number.

When manufacturing a part it is important to know whether the part is going to be used by the user in a long X or a long Y configuration so that the correct number of address buffers can be provided for the X and Y address bits. Thus two types of products must be manufactured, one containing one extra address buffer for the X address bits and one containing one extra address buffer for the Y address bits so that parts capable of being used by customers who prefer the long X can be made specifically for those customers and parts capable of being used by customers who prefer the long Y can be made specifically for those customers.

SUMMARY OF THE INVENTION

In accordance with this invention a single part is manufactured which is capable of being configured to operate in either the long X or the long Y mode depending upon the choice of the ultimate user. In accordance with this invention, an equal number of address buffers are provided for both the X address bits and the Y address bits such that the total number of buffers is an even number one greater than the number of bits required to access the memory cells in the asymmetric memory array. Thus in a 128K DRAM, one or the other of the two ninth address bit buffers associated with the X address bits and the Y address bits is surplus. At the end of wafer fabrication or as the part is to be packaged, the part is configured by setting a control circuit in one state or another. This can be done, for example, by burning out a fuse. Consequently, the output signal from the control circuit determines whether or not the extra bit from the X address buffer (a long X) or from the Y address buffer (a long Y) is transmitted to the memory array for use in addressing a particular cell in the array.

Among the advantages of this invention is that a single design can be manufactured for customers who prefer the long X and for customers who prefer the long Y with the chip being configured as one or the other near the end of the manufacturing cycle depending upon the particular customer to whom the part is to be sent. This greatly simplifies inventory and manufacturing controls and thereby reduces the cost of manufacture.

This invention will be more fully understood in conjunction with the following detailed description taken together with the following drawings.

DETAILED DESCRIPTION

The following description is meant to be illustrative only and not limiting. Other embodiments of this invention will be obvious to those skilled in the art in view of this description. The circuitry shown in the Figures is only a small part of the circuitry in a DRAM formed as an integrated circuit or as a part thereof.

Figure 1:
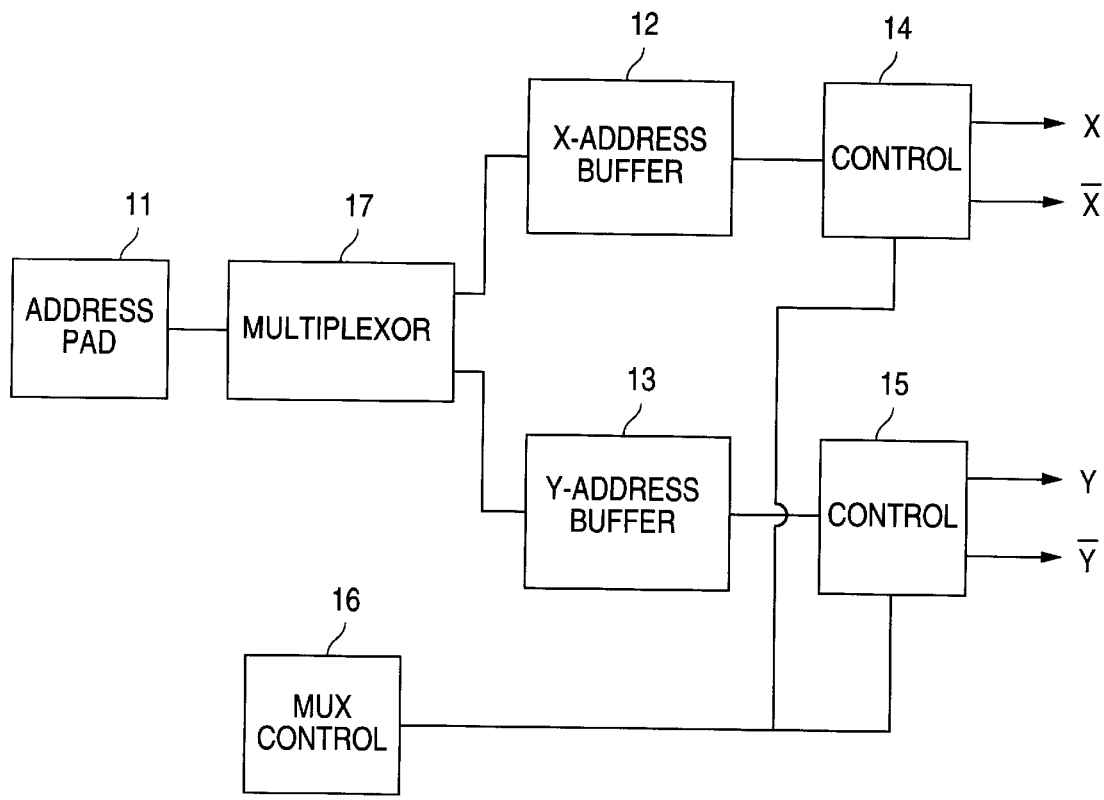
FIG. 1 shows a block diagram illustrating the structure of this invention to generate a long X or a long Y depending upon the particular customer.

In FIG. 1, address pad 11 receives an address bit from an external circuit. The DRAM contains as many of the circuits shown in FIG. 1 as there are X address bits or Y address bits, whichever is greater. In some applications the external circuit will provide the signal representing the bit at a TTL output voltage level. Address pad 11 receives this signal and transmits this signal to either an X address buffer or a Y address buffer depending upon whether the signal received on the address pad 11 is an X address bit or a Y address bit. Typically in a DRAM the row address bits are provided first to the address pads followed by the column address bits. Thus the particular buffer to which the bits are transferred, whether an X address buffer 12 or a Y address buffer 13, depends upon whether the address pad 11 is receiving the X address bits in which case the X bits are sent to buffers such as the X address buffer 12 or the Y address bits in which case the Y address bits are sent to buffers such as the Y address buffer 13. A multiplexer 17 between each address pad 11 and the X and Y address buffers 12 and 13, respectively, routes the received bit to the proper buffer.

X address buffer 12 receives the least significant X address bit from address pad 11 while Y address buffer 13 receives the least significant Y address bit from address pad 11. The state of MUX control 16 depends upon whether the memory is a long X or a long Y. If the memory is a long X, MUX control 16 activates control 14 to pass the X address bit stored in X address buffer 12 to be used with the X address bits to address the selected memory cell. Alternatively, if the memory is a long Y, MUX control 16 activates control 15 to pass the Y address bit stored in Y address buffer 13 to be used with the other Y address bits to address the selected memory cell. Thus one of the address buffers 12 and 13 is surplus and will not be used during actual operation depending upon the state of MUX control 16. MUX control 16, which can be a programmable fuse, for example, or a register, latch or memory cell, determines the particular control 14 or 15 through which an address bit will be passed for use in accessing a memory cell in a memory array.

Multiplexer 17 can be omitted if X address buffer 12 is controlled to receive and store only a long X bit and is prevented from storing a long Y bit. In this situation, in one embodiment Y address buffer 13 first stores a long X bit at the same time that the X address buffer 12 stores the long X bit, but then Y address buffer 13 is enabled to store the long Y bit when the long Y bit is received on address pad 11.

Figure 2:
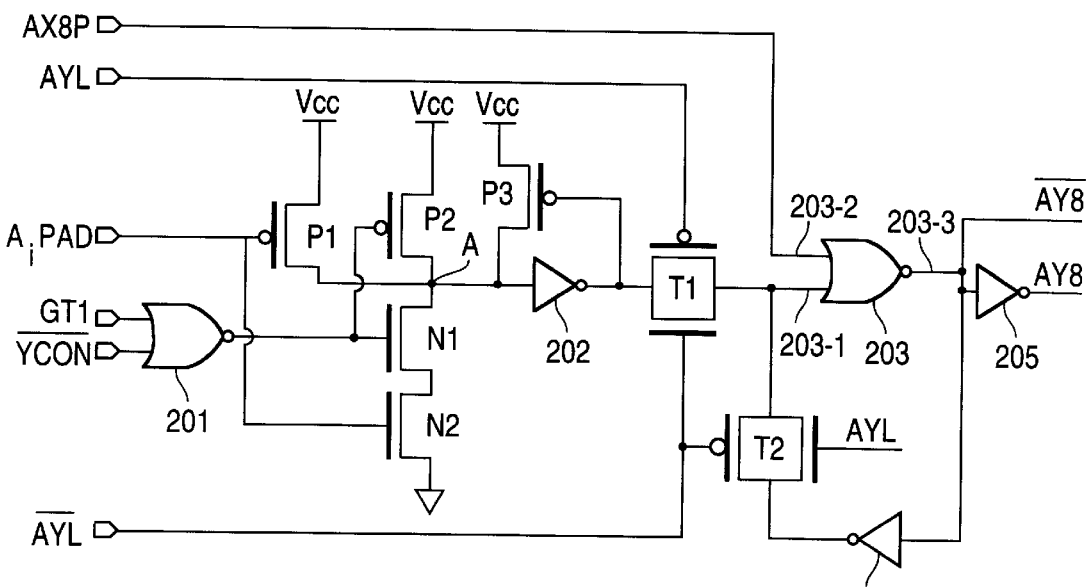
FIG. 2 is a mixed logic level and transistor level diagram illustrating the operation of this invention to transmit the long bit, either the X or the Y bit, to the address circuitry associated with the memory array.

FIG. 2 illustrates one implementation of the X control 14 and the Y control 15 shown in FIG. 1. The structure in FIG. 2 reflects the fact that in most memory arrays having an odd number of bits required to address the memory cells, the odd bit is added internally to the Y address bits for the purpose of addressing the memory cell. Thus the long X bit is essentially combined with the Y address bits for addressing a memory cell in the array.

The fact that this long bit, whether an X or a Y bit, is used in conjunction with the Y address bits is transparent to the user who believes he or she has a long X bit or long Y bit depending on how the user has specified the part.

The input signal $\overline{Ycon}$ to NOR gate 201 determines whether the long X bit or the long Y bit is used with the Y address bits to address a memory cell. Thus when $\overline{Ycon}$ goes low, NOR gate 201 is enabled. GT1 low enables all Y address buffers. The output signal from NOR gate 201 then goes high, thereby turning on N-channel transistor N1 and turning off P-channel transistor P2. The signal representing a long Y bit from the Y address buffer 13 then is provided to the circuit of FIG. 2 on the input lead labelled $A_i$PAD. This long Y bit signal is transmitted to the gates of P-channel transistor P1 and N-channel transistor N2. If the long Y bit signal is high level, P channel transistor P1 turns off and N channel transistor N2 turns on thereby bringing the voltage at node A to a low level (system ground) because N-channel transistor N1 has been turned on by the high level output signal from NOR gate 201. If the long Y bit signal from the $A_i$ PAD is low level, PMOS transistor P1 turns on and N-channel transistor N2 turns off thereby providing a high voltage (Vcc) on node A.

The signal on node A is transmitted through inverter 202. If the signal on node A is a high level signal, inverter 202 produces a low level output signal thereby turning on P-channel transistor P3 to latch the input voltage to inverter 202 at the high level Vcc. If the voltage on node A is low level, inverter 202 produces a high level output signal and P-channel transistor P3 is off. The low level input signal to inverter 202 is latched at system ground by both N-channel transistors N1 and N2 being on.

The output signal from inverter 202 is then transmitted to CMOS transmission gate T1. When AYL and $\overline{AYL}$ are low and high, respectively, transmission gate T1 passes the output signal from inverter 202 to input lead 203-1 of NOR gate 203. The signal AX8P is low level for a long Y and is applied to input lead 203-2 thereby to enable NOR gate 203. The output signal on output lead 203-3 from NOR gate 203 will be determined by the level of the signal on input lead 203-1. When the output signal from inverter 202 is high level, the output signal from NOR gate 203 on output lead 203-3 will be low level. This output signal is transmitted on lead $\overline{AY8}$ (its complement is transmitted on lead AY8) and is appended as the last bit (i.e. the least significant bit) to the Y address bits.

On the other hand, should the memory be a long X, then $\overline{Ycon}$ goes high thereby to drive the output signal from NOR gate 201 low and thereby disable the TTL buffer made up of parallel connected P-channel transistors P1 and P2 and series connected N-channel transistors N1 and N2. Parallel connected P-channel transistors P1 and P2 and series connected N-channel transistors N1 and N2 together form a NAND gate with the output signal from the NAND gate being taken at node A. With the signal $\overline{Ycon}$ high, the output signal from NOR gate 201 is low thereby turning on P-channel transistor P2 and thus pulling the voltage on node A to a high level. This high level signal is converted by inverter 202 to a low level signal and passed through transmission gate T1, enabled by AYL being low and $\overline{AYL}$ being high, to input lead 203-1 of NOR gate 203. This low level signal enables NOR gate 203. Thus, NOR gate 203 passes the signal representing the long X bit on lead AX8P to input lead 203-2 of NOR gate 203. NOR gate 203 inverts and produces the complement of this signal on the output lead 203-3 of NOR gate 203. The signal representing the X bit is sent to the Y address circuitry to become the last bit (i.e. the least significant bit) appended to the Y address being used to identify the selected memory cell.

When the signal AYL goes high, as it does when the least significant (i.e. long) X bit or Y bit has determined the state of the output signal on lead 203-3 from NOR gate 203, then $\overline{AYL}$ goes low, CMOS transmission gate T1 is turned off and CMOS transmission gate T2 is turned on. When CMOS transmission gate T2 is turned on, the output signal from NOR gate 203 is latched into the latch circuit made up of NOR gate 203, inverter 204 and transmission gate T2. Thus, the output signal on the $\overline{AY8}$ lead and the complementary output signal on the AY8 lead will reflect the state of the signal latched in the circuit made up of NOR gate 203, inverter 204 and transmission gate T2. Simultaneous turning on of gate T2 and off of gate Ti (which takes at most about one nanosecond in a typical circuit) does not change the output signal on the output lead 203-3 from NOR gate 203.

NOR gate 203 has one input lead supplying the enable signal and one input lead supplying data. When the long Y bit is being transmitted to the Y address bits, the lead 203-2 carries the enable signal. When the long X bit is being transmitted from input lead AX8P through NOR gate 203 to be used with the Y address bits, input lead 203-1 provides the enable signal to enable NOR gate 203.

As is apparent from the above description, one latch is used to hold either the long Y bit or the long X bit, depending on which bit is to be appended to the Y address bits to be used in identifying the selected memory cell.

Internally, the memory array is a long Y part. However, using the circuit of FIG. 2, the user is unaware of this and is able to treat the part as a long X part or a long Y part, depending upon the user's previously expressed preference to the manufacturer. The extra X bit, when specified by the user, is actually used as a Y bit and thus is appended as the least significant bit to the Y address bits. The state of this bit is held in the latch made up NOR gate 203, inverter 204 and gate T2. Thus, both the long X bit and the long Y bit are funneled into the Y path and the rest of the chip then treats the bit, whether it is the long X bit or the long Y bit, as though it came from the Y address pad A,PAD.

Figure 3:
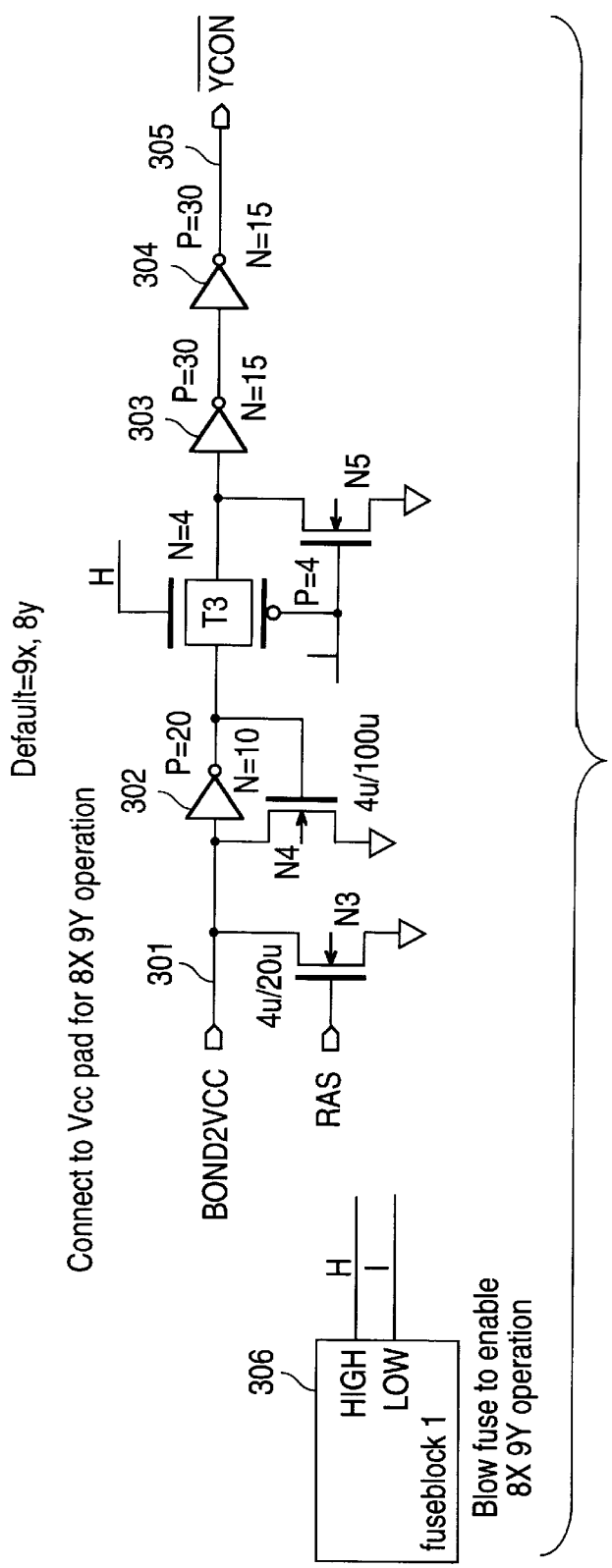
FIG. 3 is a mixed logic level and transistor level diagram illustrating the structure for generating the signal $\overline{Ycon}$ used in the structure of FIG. 2.

FIG. 3 shows the circuitry associated with the bonding pad option of this invention for use with a 128K memory. The circuitry of FIG. 3 is capable of operating with either a blown fuse or by bonding a lead to Vcc. In either case, the memory will operate in an 8X, 9Y mode (i.e. the 128K memory will operate with eight (8) X address bits and with nine (9) Y address bits).

The circuitry of FIG. 3 is used to generate the signal $\overline{Ycon}$, which, as described above, when low, causes the memory to operate in the long Y mode. By bonding the input lead 301 to Vcc, the output signal from inverter 302 is low, and, when transmission gate T3 is on, the input signal to inverter 303 is low. Thus the output signal from inverter 303 is high and becomes the input signal to inverter 304. The output signal from inverter 304 is $\overline{Ycon}$ which is low to enable NOR gate 201 (FIG. 2).

The address pins on the memory are used first to receive the row address bits, (i.e. the X address bits) and then to receive the column address bits (i.e. the Y address bits). During the power up of the memory, for example a 128K DRAM, the user has to provide eight (8) dummy RAS signals to initiate operation of the memory. Thus the N channel transistor N3 is turned on eight times. However, N channel transistor N3 is a weak on transistor (the width-to-length ratio of N3 is 4/20 or 1/5) and therefore weakly pulls down the voltage on input lead 301 to inverter 302. Because the input lead 301 to inverter 302 is bonded to Vcc, the voltage on input lead 301 remains high despite the eight positive RAS voltage pulses applied to the gate of the N channel transistor N3.

Consequently, the output signal $\overline{Ycon}$ remains low and enables the Y address buffer to receive the long Y bit.

Should the default condition for the circuit of FIG. 3 be implemented, then a long X bit is to be provided to the circuit. Under these circumstances, lead 301 is not bonded to Vcc and the eight RAS pulses applied to the gate of N channel transistor N3 pull down the voltage on the input lead to inverter 302 to a low level. Thus the signal $\overline{Ycon}$ becomes high level and thus enables the circuit of FIG. 2 to store the long X bit rather than the long Y bit. Even though N channel transistor N3 is a weak transistor, the eight positive RAS pulses are sufficient to pull down the voltage on the input lead 301 to inverter 302 to approximately system ground. The user then is responsible periodically to refresh the state of the input lead to inverter 302 by providing a RAS pulse to the gate of N channel transistor N3 to maintain the voltage on the input lead to inverter 302 at system ground. In addition, weak N channel transistor N4 (having a width-to-length ratio of 4/100 or 1/25) helps clamp the input voltage to inverter 302 at ground. Transistor N4 is turned on by the high output voltage from inverter 302.

Alternatively, fuse block 306 can be programmed. Unprogrammed, fuse block 306 produces the high and low signals H and L as shown. Fuse block 306 can be, for example, the programmable flip flop disclosed in U.S. Pat. No. 5,440,246, issued Aug. 8, 1995, and assigned to Mosel Vitelic, the assignee of this application. Unprogrammed, the high H signal is then applied to the gate of the N channel transistor in transmission gate T3 and the low L signal is applied both to the gate of the P channel transistor in transmission gate T3 and to the gate of N channel transistor N5.

Thus gate T3 is on and N channel transistor N5 is off. Gate T3 thus passes the high Vcc signal (inverted to low level by inverter 302). But when fuse block 306 is programmed, transmission gate T3 is shut off and N channel transistor N5 is turned on, thereby pulling the input signal on the input lead to inverter 303 low and causing the output signal $\overline{Ycon}$ on the output lead from inverter 304 to be low.

Thus, two options are available for generating $\overline{Ycon}$ low; bonding input lead 301 to Vcc, and blowing the fuse in fuse block 306. Both these options place the memory in the long Y mode.

Should neither of these two options be used, then by default the memory circuit operates in the long X mode with nine (9) X address bits and eight (8) Y address bits.

Thus during the presence of the nine (9) X address bits on the address pins to the memory, RAS is high and thus the input lead to inverter 302 is pulled down to a low voltage, approximately system ground, even though N channel transistor N3 is weak. The signal $\overline{Ycon}$ is thus high, thereby disabling NOR gate 201 (FIG. 2) and allowing the ninth X address bit on lead AX8P to be stored in the latch made up of NOR gate 203, inverter 204 and transmission gate T2.

Figure 4:
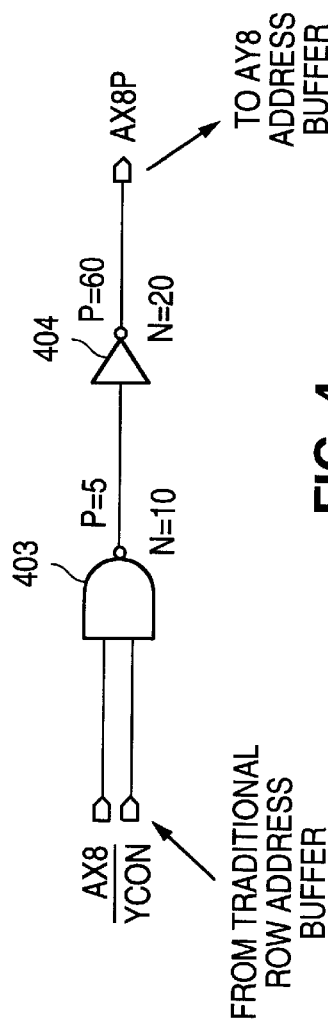
FIG. 4 shows a logic diagram for passing the long X bit (AX8 for a 128K memory) to the structure of FIG. 2.

As shown in FIG. 4, $\overline{Ycon}$ high enables NAND gate 403 to pass the ninth X address bit AX8 (the nine X address bits are 0, 1, 2, . . . 8) from the traditional row address buffer 12 shown in FIG. 1. Inverter 404 inverts the output signal from NAND gate 403 to produce the signal AX8P for transmission to the latch circuit (NOR gate 203, inverter 204 and gate T2) as shown in FIG. 2.

Other embodiments of this invention will be obvious in view of this disclosure. While the use of the number 8 in the circuit of FIG. 2 implies nine Y bits (0, 1, 2, . . . 8) and nine X bits (0, 1, 2, . . . 8) obviously this invention can be used with any DRAM memory circuit wherein the number of address bits require to address all memory cells is an odd number.

What is claimed:

1. In a memory, a structure comprising:
   a first circuit for storing an X address bit;
   a second circuit for storing a Y address bit; and
   a configurable control circuit for selecting between the read out of the X address bit and the Y address bit.

2. Structure as in claim 1 including an address pad connected to said first circuit for storing the X address bit and connected to said second circuit for storing the Y address bit.

3. Structure as in claim 2 wherein the first circuit for storing the X address bit and the second circuit for storing the Y address bit comprise a first latch circuit, the first latch circuit being used for storing the X address bit as for storing the Y address bit.

4. Structure as in claim 3 including:
   a buffer circuit for receiving either the X address signal or the Y address signal; and
   a second latch circuit for storing the output signal from the buffer circuit, said second latch circuit being capable of supplying the signal stored therein for appending to the Y address thereby to become part of the Y address.

5. Structure as in claim 4 including an inverter between the output lead from said buffer and the input lead to said second latch.

6. Structure as in claim 5 including:
   a transmission gate connected between the output lead of said inverter and the input lead to said first latch.

7. In a memory, a structure comprising:
   a first circuit for storing an X address bit;
   a second circuit for storing a Y address bit;

a control circuit for controlling the read out of one and only one of the X address bit and the Y address bit;

an address pad connected to said first circuit for storing the X address bit and connected to said second circuit for storing the Y address bit, the first circuit for storing the X address bit and the second circuit for storing the Y address bit comprising a first latch circuit, said first latch circuit being used for storing the X address bit as for storing the Y address bit;

a buffer circuit for receiving either the X address signal or the Y address signal;

a second latch circuit for storing the output signal from the buffer circuit, said second latch circuit being capable of supplying the signal stored therein for appending to the Y address thereby to become part of the Y address;

an inverter between the output lead from said buffer and the input lead to said second latch;

a first transmission gate connected between the output lead of said inverter and the input lead to said first latch, wherein said first latch includes a NOR gate one input lead to which is connected to the output of said first transmission gate and another input lead to which is connected to the source of an enabling signal.

8. Structure as in claim 7 wherein the source of said enabling signal is capable of supplying an X bit to said first latch.

9. Structure an in claim 8 wherein said first latch is capable of storing said X bit when the input buffer for receiving the Y bit is disabled.

10. Structure as in claim 9 including a second transmission gate connecting the output lead from the NOR gate to one input lead to the NOR gate thereby to store in the latch the signal being transmitted to the latch from either the Y buffer or the X buffer.

11. A semiconductor memory comprising:

a memory array including a plurality of rows and columns of memory transistors;

a plurality of X address bits for selecting one of said rows;

a plurality of Y address bits for selecting one of said columns, said Y address bits differing in number from said X address bits by N bits; and a configurable control circuit for controlling the selection of a row and a column of said array by determining whether said N bits are to be transmitted to said array from the X address bits or from the Y address bits.

12. Semiconductor memory as in claim 11 further comprising a circuit for appending certain of said X address bits to said Y address bits thereby to become part of the Y address.

13. Semiconductor memory as in claim 11 wherein said configurable control circuit is configured after the semiconductor memory is fabricated.

14. Semiconductor memory as in claim 13 further comprising a fuse structure to configure said control circuit.

15. Semiconductor memory as in claim 13 further comprising a circuit to configure said control circuit.

16. Semiconductor memory as in claim 11 wherein said Y address bits are higher in number than said X address bits by N bits.

17. Semiconductor memory as in claim 11 wherein said Y address bits are fewer in number than said X address bits by N bits.

18. A method of decoding an address in a semiconductor memory array including a plurality of rows and columns of memory transistors, said method comprising the steps of:

transmitting X address bits for selecting one of said rows;

transmitting Y address bits for selecting one of said columns, said Y address bits differing in number from said X address bits by N bits;

configuring a control circuit for determining whether said N bits are to be transmitted to said array from the X address bits or from the Y address bits.

19. Method of claim 18 further comprising appending certain of said X address bits to said Y address bits thereby to become part of the Y address.

20. Method of claim 18 wherein said configuring step is performed after the semiconductor memory is fabricated.

21. Method of claim 20 wherein the configuring step includes the step of activating a fuse structure.

22. Method of claim 20 wherein the configuring step includes the step of activating a circuit.

23. Method of claim 18 wherein said Y address bits are higher in number than said X address bits by N bits.

24. Method of claim 18 wherein said Y address bits are fewer in number than said X address bits by N bits.

* * * * *